United States Patent [19]

Suzuki et al.

[11] Patent Number: 4,858,006
[45] Date of Patent: Aug. 15, 1989

[54] METHOD AND APPARATUS FOR ESTABLISHING A SERVICING MODE OF AN ELECTRONIC APPARATUS

[75] Inventors: Masakazu Suzuki, Saitama; Masayuki Suematsu, Tokyo; Yoshinori Komiya, Kanagawa, all of Japan

[73] Assignee: Sony Corp., Tokyo, Japan

[21] Appl. No.: 203,165

[22] Filed: Jun. 7, 1988

[30] Foreign Application Priority Data

Jul. 28, 1987 [JP] Japan .................... 62-17037

[51] Int. Cl.$^4$ .................. H04N 29/12; H04N 17/00; H04N 5/63; H04N 5/44
[52] U.S. Cl. .................. 358/139; 358/190; 358/10; 358/194.1; 455/343
[58] Field of Search .......... 358/188, 190, 194.1, 358/21 R, 139, 10; 455/186, 343

[56] References Cited

U.S. PATENT DOCUMENTS

| | | | |
|---|---|---|---|
| 4,591,914 | 5/1986 | Hakamada et al. | 455/343 |
| 4,626,892 | 12/1986 | Nortrup et al. | 358/188 |
| 4,644,349 | 2/1987 | Fujita et al. | 455/186 |
| 4,651,342 | 3/1987 | Mengel | 455/343 |
| 4,701,870 | 10/1987 | Magi et al. | 364/580 |
| 4,731,654 | 3/1988 | Itabashi et al. | 358/194.1 |
| 4,750,040 | 6/1988 | Hakamada et al. | 358/190 |
| 4,769,703 | 9/1988 | Osborne et al. | 358/139 |

Primary Examiner—James J. Groody
Assistant Examiner—John K. Peng
Attorney, Agent, or Firm—Alvin Sinderbrand

[57] ABSTRACT

In controlling an electronic apparatus, such as, a color television receiver, of the type having signal processing circuits which are individually adjustable in accordance with respective control signals provided by a microcomputer or central processing unit (CPU) in response to data corresponding to predetermined or standardized conditions of the adjustable circuits and which are stored in a non-volatile memory along with a secret code, operating keys selectively actuable to provide input data to the CPU for representing an externally applied code and, in a servicing mode of the receiver, for rewriting the data in the memory and thereby changing the standardized conditions of the adjustable circuits, and inner bus lines connecting the CPU to the adjustable circuits, the non-volatile memory and the operating keys; a standby power supply provides electric power to the CPU at a time when operating keys are actuated for inputting data representing an externally applied code to the CPU, a main power supply is turned on for supplying power to the adjustable circuits and thereby causing the receiver to display a color image, and the servicing mode of the receiver is established only when the externally applied code coincides with the stored secret code and the turning on of the main power supply is effected within a predetermined period after the externally applied code has been made to be coincident with the stored secret code.

15 Claims, 3 Drawing Sheets

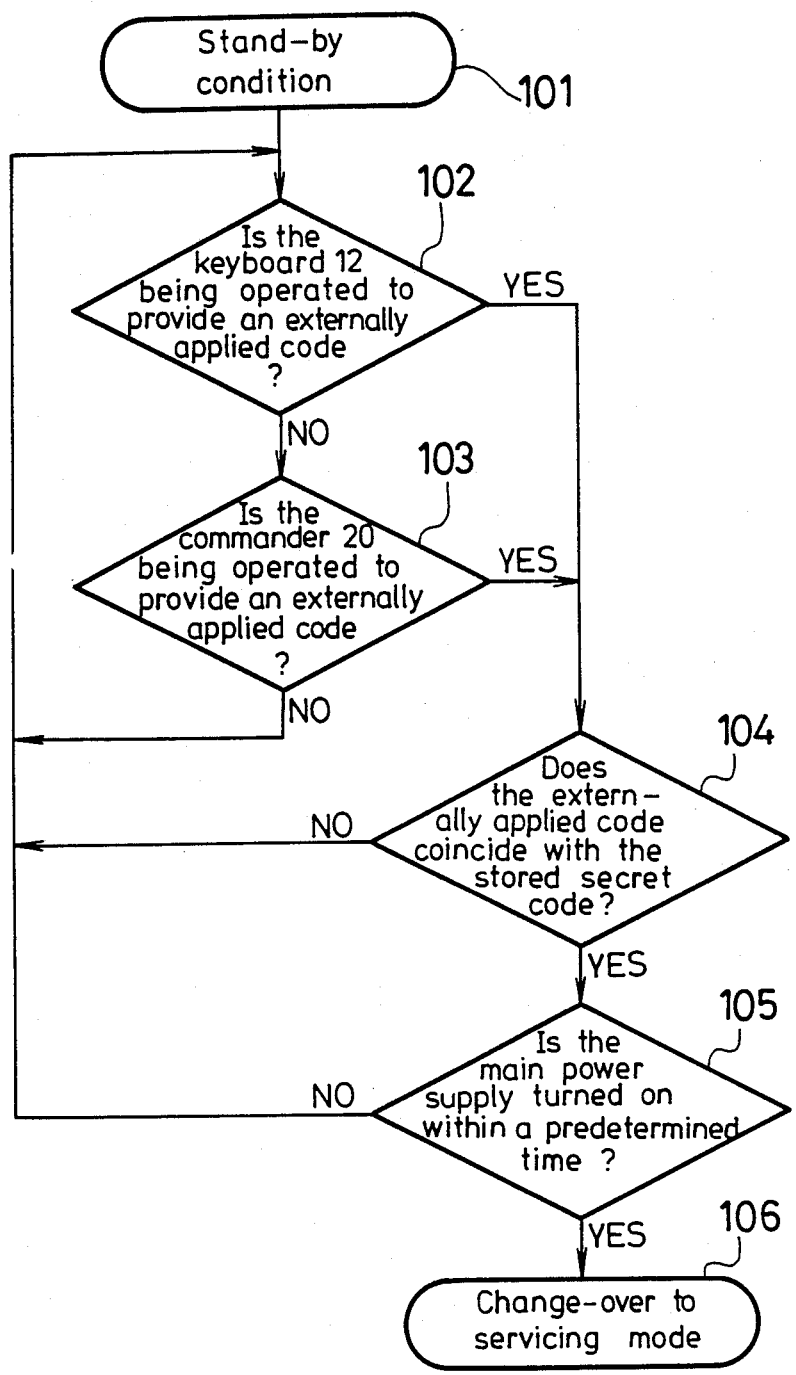

METHOD AND APPARATUS FOR ESTABLISHING A SERVICING MODE OF AN ELECTRONIC APPARATUS

BACKGROUND OF THE INVENTION

1. Field of the Invention

This invention relates generally to a method and apparatus for establishing a servicing mode of an electronic apparatus, and more particularly is directed to such method and apparatus suitable for use in connection with a color television receiver of the inner bus-type in which the signal processing circuits are controlled by means of a microcomputer or central processing unit (CPU).

2. Description of the Prior Art

Video and audio apparatus using digital signal processing circuits, such as, television receivers, video tape recorders (VTRs) and audio tape recorders have become commercially available. Most such digital video and audio apparatus use inner or internal bus lines for interconnecting a microcomputer or CPU, a memory, and other control circuitry. In a normal operating mode of the video and audio apparatus, the CPU fetches data corresponding to standardized control signal values for the several signal processing circuits of the apparatus and which have been previously stored in the memory. The CPU sends the fetched data to the appropriate circuit by way of the internal bus lines so as to suitably control the operation of the respective signal processing circuit. Further, the CPU may control the signal processing circuits of the apparatus in response to signals supplied thereto by manual actuation of a keyboard or a remote commander or controller, thereby permitting the changing, at will, of the conditions of the signal processing circuits. The provision of a television receiver with an internal or inner bus system has the advantage of permitting standardized, centralized and simplified testing of the circuitry of the receiver during assembling and servicing thereof, thereby substantially reducing the manufacturing and maintenance cost. A television receiver provided with such an internal bus system is disclosed, by way of example, in U.S. Pat. No. 4,701,870, which has a common assignee herewith.

In the case of an inner bus television receiver, the data stored in the memory in correspondence to predetermined conditions of the adjustable circuits, for example, for establishing standardized values of contrast, hue and balance of a displayed color image, may be rewritten or changed to data corresponding to other values or predetermined conditions when testing the operation of the television receiver at the time of its manufacture, or when the television receiver is undergoing maintenance or servicing and it is found necessary to adjust such characteristics of the displayed image due to secular changes that have occurred in components of the receiver. In order to rewrite or change the data stored in the memory, it is necessary to establish a servicing mode of the television receiver. For this purpose, known television receivers of the inner bus type have been provided with a change-over switch which is manually actuable for changing from the ordinary operation mode to the servicing mode of the television receiver. However, when such manually actuable change-over switch is provided, there is the danger that a user of the television receiver may inadvertently actuate such switch and thereby establish the servicing mode of the television receiver, in which mode, the stored data for establishing the standardized conditions of the displayed color image may be disturbed.

In order to avoid the foregoing problem, an inner bus television receiver may be arranged so that, when electric power is supplied to the receiver, establishment of the servicing mode thereof requires that a plurality of switches, such as, the switches associated with the channel selection keys or push-buttons, need to be actuated in a predetermined order. Although the foregoing arrangement reduces the chances of inadvertently establishing the servicing mode of the television receiver, it is nevertheless still possible that the keys or push-buttons may, by chance, be actuated in the predetermined order for establishing the servicing mode and thereby permitting disturbance of the data stored in the memory for maintaining the standardized conditions of the displayed image.

OBJECTS AND SUMMARY OF THE INVENTION

Accordingly, it is an object of the present invention to provide a method and apparatus for establishing a servicing mode of an inner bus television receiver or other electronic apparatus, and which simply and securely avoids inadvertent change-over of the apparatus from its normal operating mode to the servicing mode.

In accordance with an aspect of this invention, a method of controlling an electronic apparatus comprising a plurality of circuits which are individually adjustable in accordance with respective control signals, non-volatile memory means for storing a secret code and for storing data corresponding to predetermined conditions of the adjustable circuits, respectively, a central processing unit (CPU) adapted to receive the data from the memory means and to provide the corresponding control signals to the adjustable circuits, a main power supply source for supplying electric power to the adjustable circuits, a stand-by power supply source for supplying electric power to the CPU, key input means selectively operable to provide input data to the CPU for representing an externally applied code and, in a servicing mode of the apparatus, for rewriting in the non-volatile memory means the data corresponding to predetermined conditions of the adjustable circuits, and inner bus means for connecting the CPU to the adjustable circuits, the non-volatile memory means and the key input means, such method comprising the steps of:

turning on the stand-by power supply source;

operating the key input means for inputting data representing the externally applied code to the CPU;

turning on the main power supply source for supplying electric power to the adjustable circuits; and establishing the servicing mode of the electronic apparatus only when the externally applied code coincides with the secret code stored in the non-volatile memory means and the turning on of the main power supply source is effected within a predetermined period after the externally applied code provided by operation of the key input means is made to be coincident with the stored secret code.

In accordance with another aspect of this invention, an electronic apparatus, for example, in the form of a color television receiver, comprises a plurality of circuits which are individually adjustable in accordance with respective control signals, non-volatile memory means for storing a secret code and for storing data corresponding to predetermined conditions of the adjustable circuits, respectively, a central processing unit (CPU) adapted to receive the data read from the memory means and to provide the corresponding control signals to the adjustable circuits, main power supply means for supplying electric power to the adjustable circuits, stand-by power supply means for supplying electric power to the CPU, key input means selectively operable to provide input data to the CPU for representing an externally applied code and, in a servicing mode of the apparatus, for rewriting in the non-volatile memory means the data corresponding to predetermined conditions of the adjustable circuits, inner bus means for connecting the CPU to the adjustable circuits, the non-volatile memory means and the key input means, and means for establishing the servicing mode of the apparatus only when the externally applied code coincides with the stored secret code stored in the non-volatile memory means and the main power supply means is turned on within a predetermined period after the externally applied code is made to be coincident with the stored secret code.

The above, and other objects, features and advantages of the present invention, will become apparent in the following detailed description of a preferred embodiment of the invention which is to be read in conjunction with the accompanying drawings in which corresponding parts are identified by the same reference numerals in the several views.

BRIEF DESCRIPTION OF THE DRAWINGS

FIG. 3 is a flow chart to which reference will be made in explaining the operations for establishing the servicing mode of the television receiver in accordance with the present invention.

DESCRIPTION OF THE PREFERRED EMBODIMENT

Figure 1:
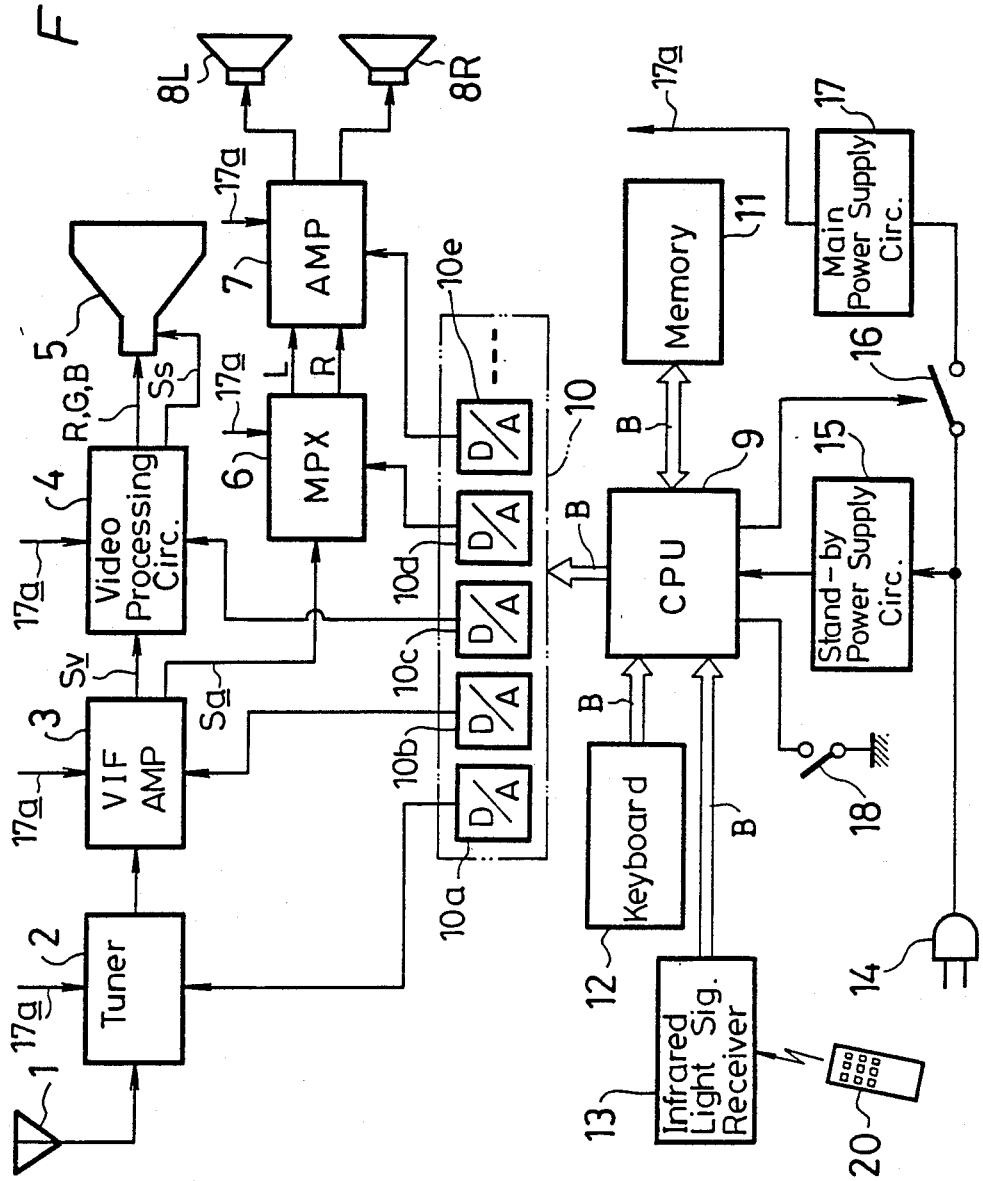
FIG. 1 is a block diagram of a television receiver of the type to which the present invention is desirably applied for establishing the servicing mode thereof.

A method and apparatus for establishing a servicing mode of an electronic apparatus in accordance with an embodiment of this invention will now be described in detail with reference to an inner bus-type color television receiver. As shown particularly on FIG. 1, such inner bus-type color television receiver includes an antenna 1 from which a received broadcast signal is supplied to a tuner 2 which extracts an intermediate frequency signal and supplies the same to an intermediate frequency amplifier 3. A video signal $S_v$ is supplied from an output terminal of the intermediate frequency amplifier 3 to a video processing circuit 4 which provides therefrom color signals R, G and B and horizontal and vertical synchronizing signals $S_s$ which are supplied to a color cathode ray tube 5.

The intermediate frequency amplifier 3 further provides, at another output terminal thereof, an audio signal $S_a$ which is supplied to a multiplexer 6 in which it is separated into a left-channel audio signal L and a right-channel audio signal R. The separated left-channel and right-channel audio signals L and R are supplied through an audio amplifier 7 to a left-channel speaker 8L and a right-channel speaker 8R, respectively. Thus, in normal operation of the described television receiver, a color image corresponding to the video portion of a broadcast television signal is displayed by the color cathode ray tube 5, while the left-channel and right-channel audio signals are audibly reproduced by the speakers 8L and 8R, respectively.

In the color television receiver being described with reference to FIG. 1, the operations of the various circuits acting on the received signals, that is, tuner 2, intermediate frequency amplifier 3, video processing circuit 4, multiplexer 6 and audio amplifier 7, are adjustably controlled by respective control signals provided by a central processing unit (CPU) 9 through a digital-to-analog converter unit 10. More particularly, the CPU 9 is connected with the tuner 2, the intermediate frequency amplifier 3, the image or video processing circuit 4, the multiplexer 6 and the audio amplifier 7 through D/A converters 10a, 10b, 10c, 10d and 10e, respectively, included in a converter unit 10 and which supply analog control signals to the respective adjustable circuits in response to the reception of digital control signals or data from the CPU 9 by way of an internal bus line B.

The CPU 9 is also connected through the bus line B with a non-volatile memory 11 which is adapted to store data corresponding to predetermined conditions of the adjustable circuits, and also adapted to store a secret number or code for avoiding inadvertent establishment of the servicing mode of the receiver as hereinafter described in detail. The data corresponding to predetermined conditions of the adjustable circuits may, for example, correspond to control signals selected to achieve standardized contrast, hue and balance of a color image displayed by the tube 5.

The CPU 9 is further shown to be connected through the bus line B with a key board 12 having keys or push-buttons that are manually actuable for controlling or changing, at will, corresponding control signals supplied by the CPU 9 to the adjustably controllable circuits 2, 3, 4, 6, 7 and the like. Further, an infrared light signal receiving element 13 is connected to the CPU 9 by way of the bus line B and is operative, in response to the reception of infrared signals from a remote commander or control signal transmitter 20 which is hereinafter described in greater detail, to provide data to the CPU similar to that obtained when the key board 12 is actuated. The CPU 9 is also operative to control the changeover of the operating mode of the television receiver, that is, the changeover between a normal operating mode and a servicing mode, as hereinafter described.

Figure 2:
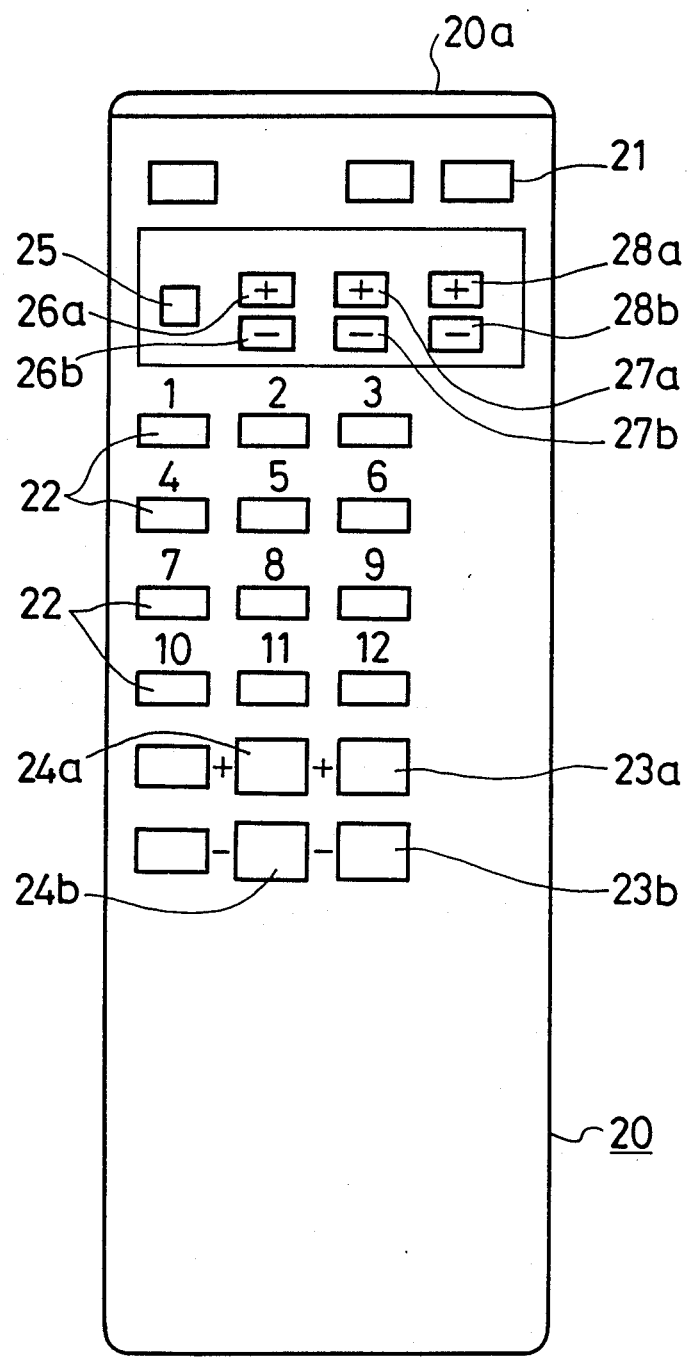
FIG. 2 is a diagrammatic elevational view showing the arrangement of keys or push-buttons on the panel of a remote commander or controller that may be desirably used with the television receiver of FIG. 1.

The television receiver according to the embodiment of the invention being presently described further includes a stand-by power supply circuit 15 adapted to be continuously connected with a commercial electric power source through a conventional plug 14 so as to continuously supply electric power to the CPU 9, and a main power supply circuit 17 which is connected to the plug 14 through contacts of a relay 16 controlled by the CPU 9 so that the commercial electric power source is connected to the main power supply circuit 17 for energizing the latter only when the contacts of relay 16 are closed. The main power supply circuit 17 is shown to be connected, as at 17a, to each of the circuits to be powered thereby, for example, the circuits 2, 3, 4, 6 and 7, so that, in the illustrated embodiment of the invention, a color image is displayed by the tube 5 and sounds are emitted from the speakers 8L and 8R only when the contacts of relay 16 are closed. The CPU 9 closes the contacts of relay 16 in response to the manual actuation of a power supply switch 18 shown to be connected with the CPU 9, and which is provided on the television receiver, or in response to the manual actuation of a power supply key 21 provided on the remote commander 20, as shown on FIG. 2.

The commander or control signal transmitter 20 for remotely controlling the television receiver is shown to be provided, at one end face thereof, with an infrared light signal emitting device 20a from which a suitably modulated infrared light beam is directed to impinge on an infrared light sensitive element of the infrared light signal receiver 13 and thereby transmit control signals to the latter in accordance with the manual actuation by the user of various operation controlling keys or push-buttons of the commander 20. More specifically, and as shown on FIG. 2, the commander 20 has, in addition to the power supply key 21, a channel-selecting key pad 22 comprised of a number of keys or push-buttons corresponding to respective numbered channels and being actuable for selecting the respectively numbered broadcast channels, channel up/down keys 23a and 23b actuable for increasing and decreasing, respectively, the number of the channel selected to be received, and volume adjusting keys 24a and 24b for increasing and decreasing, respectively, the volume of the sound issuing from the speakers 8L and 8R. Further, the commander is shown to have a standard setting key 25, contrast adjusting keys 26a and 26b, hue adjusting keys 27a and 27b, and balance adjusting keys 28a and 28b. It will be appreciated that the commander 20 is operative, in response to the actuation of any of the previously described keys thereof, to emit a correspondingly modulated infrared light signal from the device 20a for controlling a corresponding function of the television receiver.

More specifically, actuation of either of the contrast adjusting keys 26a and 26b is effective to change, at will, the contrast of the displayed image, actuation of either of the hue adjusting keys 27a and 27b is effective to change, at will, the hue or color phase of the image, and actuation of either of the balance adjusting keys 28a and 28b is effective to change, at will, the balance of the displayed image. On the other hand, in response to actuation of the standard setting key 25, the contrast, hue and balance of the displayed image are automatically set to respective intermediate or standardized values which are predetermined and stored in the nonvolatile memory 11, thereby to adjust simultaneously the several characteristics of the displayed image to a standardized condition. Data corresponding to predetermined conditions of the adjustable circuits for establishing the standardized values of the contrast, hue and balance of a displayed image are written into the non-volatile memory 11 during the manufacturing of the television receiver, and particularly, during the final adjustments or alignments of the circuits after assembling of the various components. Further, the data written in the non-volatile memory 11 and corresponding to the predetermined conditions of the adjustable circuits can be rewritten in the course of the maintenance or servicing of the television receiver, for example, when checking or repairing the same, and may compensate for secular or relatively long term changes in the component parts of the television receiver, for example, in the cathode ray tube 5 or the like. In order to effect such rewriting of the data stored in the memory 11 and corresponding to the predetermined conditions of the adjustable circuits, it is necessary to establish a servicing mode of the television receiver, that is, to effect the change-over of the television receiver from its normal operating mode to a servicing mode.

The manner in which the television receiver is changed-over from its normal operating mode to its servicing mode in accordance with the present invention will now be described. Initially, the television receiver has a secret number or code suitably stored in its non-volatile memory 11. For example, such stored secret code or number may consist of the numerals "4, 3, 2, 1" in the order indicated. Generally, in accordance with the present invention, the television receiver having such secret number or code stored in its memory 11 initially receives only stand-by power delivered to the CPU 9 from the stand-by power supply circuit 15, while the contacts of relay 16 remain open with the result that the main power supply circuit 17 is turned off or inoperative. With the television receiver in the foregoing condition, that is, only receiving stand-by power from the circuit 15, the operator of the television receiver actuates a plurality of the channel selecting keys of the keyboard 12, or a plurality of the channel selecting keys 22 on the commander 20 in an order thought to correspond to that of the code stored in the non-volatile memory 11. The externally applied code resulting from such actuation of the keys of keyboard 12 or the keys 22 of commander 20 causes corresponding data to be applied to the CPU either from the keyboard 12 or from the infrared light signal receiver 13, and the CPU 9 compares such externally applied code to the secret number or code previously stored in the memory 11 and detects if and when the externally applied code is coincident with the stored secret number or code.

After the channel selection keys of the keyboard 12 or the channel selection keys 22 of the commander 20 have been selectively actuated to provide the externally applied code which is intended to coincide with the secret number or code stored in the memory 11, the user or operator actuates the power supply switch 18 on the television receiver, or the power supply key 21 on the commander 20, and the CPU 9 responds thereto by energizing the relay 16 and thereby closing the contacts of the latter for rendering operative the main power supply circuit 17. The CPU 9 is operative to establish the servicing mode of the television receiver only when the main power supply circuit 17 is made operative within a predetermined period, for example, one minute, after the externally applied code provided by operation of the channel selection keys of the keyboard 12 or the channel selection keys 22 of the commander 20 is made to be coincident with the secret number or code stored in the memory 11.

As shown on FIG. 3, the routine or program for changing-over the television receiver from its normal operating mode to its servicing mode in accordance with the present invention starts, in step 101, with the television receiver in its stand-by condition, that is, with only the stand-by power supply circuit 15 operative to supply electric power to the CPU 9, and with the relay 16 deenergized to open its contacts and thereby render inoperative the main power supply circuit 17. With the television receiver in its stand-by condition, it is detected in the step 102 whether or not the channel selecting keys of the keyboard 12 on the television receiver are being operated to provide an externally applied code. If an externally applied code is not detected in step 102, the program or routine proceeds to the step 103 in which it is detected whether or not the channel selecting keys 22 of the commander 20 are being operated to provide an externally applied code. If an externally applied code is not detected in the step 103, the program returns to the start thereof. However, if an externally applied code is detected in either the step 102 or the step 103, the program proceeds to the step 104 in which it is detected whether or not the externally applied code resulting from the operation of either the keyboard 12 or the commander 20 coincides with the secret code stored in the non-volatile memory 11. If the externally applied code does not coincide with the stored secret code, the program is returned to the start thereof. However, if it is detected in step 104 that the externally applied code coincides with the stored secret code, the program proceeds to the step 105 in which it is detected whether or not the main power supply 17 is turned on, as by actuation of the power supply switch 18 on the television receiver or the power supply key 21 on the commander 20, within a predetermined period of time, for example, one minute, after the externally applied code has been made to coincide with the stored secret code. If the main power supply circuit 17 is not turned on or made operative within such predetermined period of time, the program returns to the start thereof. However, if the main power supply circuit 17 is turned on within the predetermined period of time, the program proceeds to the step 106 in which the television receiver is changed-over to its servicing mode.

It will be appreciated from the above that, if the channel numbers indicated by the channel selecting keys that are operated on the keyboard 12 or the remote commander 20 differ, in such numbers or in the order thereof, from the numbers and order thereof in the secret code stored in the memory 11, or if the main power supply is not turned on within the predetermined time period after the externally applied code is made to coincide with the stored secret code, the CPU 9 prevents the change-over of the television receiver to its servicing mode. Thus, inadvertent change-over of the television receiver to its servicing mode is securely prevented.

On the other hand, when the externally applied code resulting from actuation of the channel selecting keys of the keyboard 12 or of the remote commander 20 is made to coincide with the secret code stored in the memory 11 and the main power supply circuit 17 is turned on within the predetermined time period after such coincidence is attained, the television receiver is reliably changed-over to its servicing mode in which the operativeness of the main television supply circuit 17 causes the television receiver to display a color image or images on its cathode ray tube 5 corresponding to the broadcast or other video signal being applied to the receiver.

The establishment of the servicing mode of the television receiver by the CPU 9 allows rewriting of the standardized intermediate values for the contrast, hue and balance of the displayed image which are stored in the non-volatile memory 11. In the present embodiment of the invention, such rewriting is effected by actuating the respective keys on the remote commander 20. More specifically, with the television receiver in its servicing mode, the stored standard value of the contrast is rewritten by suitably operating the contrast adjusting keys 26a and 26b of the commander 20, the stored standard value of the hue is rewritten by suitably operating the hue adjusting keys 27a and 27b, and the stored standard value of the balance is rewritten by suitably operating the balance adjusting keys 28a and 28b. During such rewriting of the stored standard values with the television receiver in its servicing mode, the color image is displayed on the face of the tube 5 so that the same can be monitored to determine or confirm how the rewriting of the stored standard values by the selective operation of the keys 26a, 26b, 27a, 27b, 28a and 28b affects the appearance of the displayed color image.

After the adjustment of the color image by the rewriting of the standardized values stored in the memory 11 has been completed, the power supply switch 18 or key 21 is again actuated to cause the CPU 9 to open the contacts of the relay 16 and thereby turn off the main power supply circuit 17. In response to the foregoing, the CPU 9 returns the television receiver from its servicing mode to its ordinary or normal operating mode, with the rewritten or adjusted standardized values being stored in the non-volatile memory 11.

If the power supply switch 18 or key 21 is actuated to cause the CPU 9 to turn on the main power supply circuit 17 more than the predetermined period of time, for example, one minute, after the channel selection keys have been actuated to provide an externally applied code that coincides with the stored secret code, or if the main power supply circuit 17 is turned on without first actuating the channel selection keys to provide an externally applied code, the television receiver is made operative in its normal operating mode so that a color image is displayed by the tube 5 and sounds are emitted from the speakers 8L and 8R in correspondence with a broadcast television signal being received by the antenna 1. With the television receiver in its normal operating mode, actuation of the channel selection keys 22 of the commander 20 will merely change the broadcast channel being received. Similarly, actuation of one or the other of the keys 23a and 23b will incrementally change the selected channel being received, while actuation of one or the other of the keys 24a and 24b will change the volume of the emitted sound. Furthermore, with the television receiver in its normal operating mode, the contrast, hue and balance of the displayed color image may be changed, at will, and without reference to the standardized values therefor then stored in the memory 11, by selectively actuating the keys 26a and 26b, the keys 27a and 27b and the keys 28a and 28b, respectively. Moreover, with the television receiver in its normal operating mode, actuation of the standard setting key 25 on the commander 20 causes the CPU 9 to fetch or read the standardized values for the contrast, hue and balance then stored in the memory 11 and to provide corresponding control signals through the converter 10 to the adjustable circuits 2, 3 and 4, with the result that the color image displayed by the tube 5 then exhibits the standardized values of contrast, hue and balance.

It will be appreciated that, the actuation of the channel selection keys 22 of the commander 20 or the channel selection keys of the keyboard 12 for providing an externally applied code coinciding with the stored secret code is effected, in the method for establishing the servicing mode according to the above described embodiment of the invention, at a time when the CPU 9 is supplied only with the stand-by power from the stand-by power supply circuit 15. Thus, even if the channel selection keys on the commander 20 or the keyboard 12 are accidentally actuated in correspondence with the stored secret code at a time when the television receiver is being supplied with power from the main power supply circuit 17, that is, at a time when the television receiver is in normal use, change-over to the servicing mode cannot occur by inadvertence, and, accordingly, the standardized values stored in the memory 11 cannot be disturbed during the user's ordinary operation of the receiver. Furthermore, since the channel selection keys of the keyboard 12 or of the commander 20 are used for effecting change-over from the normal operating mode to the servicing mode, there is no need to provide an additional operating key for that purpose with the result that the construction and control of the television receiver are simplified to that extent. Nevertheless, when the channel selection keys are actuated in the order corresponding to the stored secret code at a time when only the stand-by power supply circuit 15 is turned on to provide an externally applied code coinciding to the stored secret code and, within the predetermined period of time thereafter, the main power supply circuit 17 is turned on to establish the servicing mode of the television receiver, the stored standardized values can be readily adjusted or rewritten so as to compensate for secular changes, that is, changes occurring over a long period of time, for example, due to aging, of the television receiver.

In the illustrated embodiment of the invention, the stand-by power supply circuit 15 is shown to be continuously connected, as by the plug 14, with a commercial A.C. power source. However, a battery, capacitor or the like may be provided as a backup or secondary source of power for the stand-by power supply circuit 15. Further, although the present invention has been shown and described as applied to an inner bus television receiver, it will be understood that the invention can be similarly applied to other electronic apparatus, such as, video tape recorders and the like.

Having specifically described a preferred embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A method of controlling an electronic apparatus comprising a plurality of circuits which are individually adjustable in accordance with respective control signals, non-volatile memory means for storing a secret code and for storing data corresponding to predetermined conditions of said adjustable circuits, respectively, a central processing unit adapted to receive said data from said memory means and to provide said control signals to said adjustable circuits in correspondence with said data, a main power supply source for supplying electric power to said adjustable circuits, a stand-by power supply source for supplying electric power to said central processing unit, key input means selectively operable to provide input data to said central processing unit for representing an externally applied code and, in a servicing mode of the apparatus, for re-writing in said non-volatile memory means said data corresponding to predetermined conditions of said adjustable circuits, and inner bus means for connecting said central processing unit to said adjustable circuits, said non-volatile memory means and said key input means, said method comprising the steps of:
   turning on said stand-by power supply source;
   operating said key input means for inputting data representing said externally applied code to said central processing unit;
   turning on said main power supply source for supplying power to said adjustable circuits; and
   establishing said servicing mode of the apparatus only when said externally applied code coincides with said secret code stored in said non-volatile memory means and said turning on of the main power supply source is effected within a predetermined period after said externally applied code provided by operation of said key input means is made to be coincident with said secret code.

2. A method according to claim 1; in which said electronic apparatus is a color television receiver.

3. A method according to claim 2; in which, when said servicing mode is established, said key input means are operated for said rewriting of data in said non-volatile memory means so as to compensate for changed conditions of at least one of said adjustable circuits.

4. A method according to claim 3; in which said rewriting of data changes at least one of the contrast, hue and balance of a color image provided by said color television receiver.

5. A method according to claim 1; in which said key input means includes a remote commander.

6. A method of controlling an electronic apparatus comprising a plurality of circuits which are individually adjustable in accordance with respective control signals, non-volatile memory means for storing a secret code and for storing data corresponding to predetermined conditions of said adjustable circuits, respectively, a central processing unit adapted to receive said data from said memory means and to provide said control signals to said adjustable circuits in correspondence with said data, a main power supply source for supplying electric power to said adjustable circuits, a stand-by power supply source for supplying electric power to said central processing unit, key input means selectively operable to provide input data to said central processing unit for representing an externally applied code and, in a servicing mode of the apparatus, for re-writing in said non-volatile memory means said data corresponding to predetermined conditions of said adjustable circuits, and inner bus means for connecting said central processing unit to said adjustable circuits, said non-volatile memory means and said key input means, said method comprising the steps of:
   turning on said stand-by power supply source;
   operating said key input means for inputting data representing said externally applied code to said central processing unit;
   detecting coincidence of said externally applied code with said secret code stored in said non-volatile memory means;
   turning on said main power supply source for supplying power to said adjustable circuits;
   detecting if said main power supply source is turned on within a predetermined period of time after detection of said coincidence of said externally applied code with said secret code; and
   establishing said servicing mode of the apparatus only when said coincidence of the externally applied code with said secret code stored in said non-volatile memory means is detected and said turning on of the main power supply source is detected within said predetermined period of time from the detected coincidence.

7. A method according to claim 6; in which said electronic apparatus is a color television receiver, and said rewriting of data changes at least one of the contrast, hue and balance of a color image displayed by said color television receiver when said main power supply source is turned on.

8. A method according to claim 7; in which said key input means include first keys operable for channel selection and for generating said externally applied code, and second keys operable, in said servicing mode, for said rewriting of the data stored in said non-volatile memory means and, in a normal operating mode of the television receiver, for changing at will at least said one of the contrast, hue and balance of the displayed color image.

9. A method according to claim 8; in which, in said normal operating mode, the data stored in said non-volatile memory means are read out therefrom for correspondingly standardizing at least said one of the contrast, hue and balance of the displayed color image.

10. A method according to claim 6; in which said key input means includes a remote commander.

11. An electronic apparatus comprising a plurality of circuits which are individually adjustable in accordance with respective control signals, non-volatile memory means for storing a secret code and for storing data corresponding to predetermined conditions of said adjustable circuits, respectively, a central processing unit adapted to receive said data read from said memory means and to provide said control signals to said adjustable circuits in correspondence with said read data, main power supply means for supplying electric power to said adjustable circuits, stand-by power supply means for supplying electric power to said central processing unit, key input means selectively operable to provide input data to said central processing unit for representing an externally applied code and, in a servicing mode of the apparatus, for re-writing in said non-volatile memory means said data corresponding to predetermined conditions of said adjustable circuits, inner bus means for connecting said central processing unit to said adjustable circuits, said non-volatile memory means and said key input means, and means for establishing said servicing mode of the apparatus only when said externally applied code coincides with said secret code stored in said non-volatile memory means and said main power supply means is turned on within a predetermined period after said externally applied code is made to be coincident with said secret code.

12. A color television receiver comprising a plurality of circuits which are individually adjustable in accordance with respective control signals for varying at least one of the contrast, hue and balance of a color image displayed by the receiver;
   non-volatile memory means for storing a secret code and data corresponding to predetermined conditions of said adjustable circuits, respectively;
   a central processing unit adapted to receive said data from said memory means and to provide said control signals to said circuits in correspondence with said data;
   main power supply means adapted to be turned on for supplying electric power to said adjustable circuits;
   stand-by power supply means for supplying electric power to said central processing unit;
   key input means selectively operable to provide input data to said central processing unit for representing an externally applied code and, in a servicing mode of the apparatus, for re-writing in said non-volatile memory means said data corresponding to predetermined conditions of said adjustable circuits;
   inner bus means for connecting said central processing unit to said adjustable circuits, said non-volatile memory means and said key input means; and
   means for establishing said servicing mode of the apparatus only when said externally applied code coincides with said secret code stored in said non-volatile memory means and said main power supply means is turned on within a predetermined period after said externally applied code is made to be coincident with said secret code.

13. A color television receiver according to claim 12; in which said key input means includes first keys operable for channel selection and for generating said externally applied code, and second keys operable, in said servicing mode, for said rewriting of the data stored in said non-volatile memory means and, in a normal operating mode of the television receiver, for changing at will at least said one of the contrast, hue and balance of the displayed color image.

14. A color television receiver according to claim 13; in which said key input means further includes a standard setting key operable in said normal operating mode to cause reading out of the data stored in said non-volatile memory means for correspondingly standardizing at least said one of the contrast, hue and balance of the displayed color image.

15. A color television receiver according to claim 14; in which said key input means are included in a remote commander.

* * * * *